United States Patent [19]

Boutros et al.

[11] 4,276,523

[45] Jun. 30, 1981

[54] HIGH DENSITY FILTER CONNECTOR

[75] Inventors: Kamal S. Boutros, Downsview; Michael J. Coleman, Oshawa, both of Canada

[73] Assignee: Bunker Ramo Corporation, Oak Brook, Ill.

[21] Appl. No.: 67,251

[22] Filed: Aug. 17, 1979

[51] Int. Cl.[3] .................... H03H 7/01; H01R 13/648; H01R 13/66

[52] U.S. Cl. .................... 333/182; 333/184; 333/185; 339/143 R; 339/147 R

[58] Field of Search .................... 333/181–185; 29/629, 630 R, 630 A, 630 B; 339/143 R, 143 C, 147 R, 147 P, 276 R, 276 C, 277 C, 278 R, 278 C, 278 D, 278 M

[56] References Cited

U.S. PATENT DOCUMENTS

| | | | |
|---|---|---|---|
| 3,322,885 | 5/1967 | May et al. | 174/78 |
| 3,375,483 | 3/1968 | Phillips | 339/143 R |
| 3,435,387 | 3/1969 | Reinke et al. | 333/183 |
| 3,535,676 | 10/1970 | Schultz, Sr. | 339/143 R |
| 3,539,973 | 11/1970 | Antes et al. | 339/147 R X |
| 3,721,869 | 3/1973 | Paoli | 338/183 X |
| 3,743,979 | 7/1973 | Schor | 333/182 X |
| 3,840,841 | 10/1974 | Clark | 339/147 P |
| 3,854,107 | 12/1974 | Tuchto et al. | 333/183 |
| 4,029,386 | 6/1977 | Krantz, Jr. et al. | 339/143 R |
| 4,126,370 | 11/1978 | Nijman | 339/143 R |
| 4,195,272 | 3/1980 | Boutros | 333/182 |

FOREIGN PATENT DOCUMENTS

| | | |
|---|---|---|
| 1566329 | 5/1969 | France . |
| 1255109 | 11/1971 | United Kingdom . |

*Primary Examiner*—Marvin L. Nussbaum

*Attorney, Agent, or Firm*—F. M. Arbuckle; T. J. Haller

[57] ABSTRACT

A multiple contact filter connector capable of accommodating high RF currents and a method of manufacturing the same are disclosed. The connector includes an outer metallic shell, a dielectric body within the shell and at least one network filter contact assembly. The inner body has at least one through channel and a transverse cavity which communicates with the channel and an annular metallic ring disposed inwardly of the shell. The network filter contact assembly has a ground electrode and a pin electrode and is disposed within the portion of the channel bridging the cavity. Conductive curable filler material is charged into the cavity around and in contact with the ground electrode and annular ring to form a ground plate for the connector. A pair of spaced apart conductive plates may be disposed transversely to the ground electrode and ring to be in electrical contact therewith and the filler material.

26 Claims, 5 Drawing Figures

11
12
13
25
27
30
32
33
33a
34
35
40
42
43
45
46
47
50
51
52
60
62
64
66
68
70
74

HIGH DENSITY FILTER CONNECTOR

BACKGROUND OF THE INVENTION

The present invention is directed generally to electrical connectors of a type providing protection from electromagnetic interference (EMI). More particularly, the invention is directed to a multiple contact filter connector capable of conducting high RF currents and a method of fabricating the same at greatly reduced manufacturing cost.

In numerous applications, such as where long unshielded cable runs enter a shielded housing containing circuitry sensitive to extraneous signals picked up by the cable, it is necessary to provide electrical filter networks as an integral part of a connector to suppress transients and other undesired signals, such as EMI, which may otherwise exist on circuits interconnected by the connector. An illustrative prior art filter connector used in such applications is shown and described in Tuchto et al, U.S. Pat. No. 3,854,107 and pending Boutros U.S. patent application Ser. No. 875,363, filed Feb. 6, 1978 and now U.S. Pat. No. 4,195,272, both assigned to the same assignee as the present invention.

The filter connector illustrated in the aforementioned Tuchto et al patent includes a dielectric body supporting a plurality of filter contacts and a thin conductive foil ground plate. Each filter contact includes a filter network comprising multiple concentric filter elements coaxially mounted on a reduced diameter portion of the contact and an outer ground electrode. The filter contacts are dimensioned and configured to accommodate insertion and removal from the dielectric body with the ground electrodes contacting the thin foil ground plate in a wiping action.

While multiple contact filter connectors of the foregoing variety have proven successful when used to conduct relatively low RF currents of approximately one-quarter ampere, they have not been suitable for conducting high RF currents of, for example, three or more amperes. Because the ground plates are thin, and the surface contact with the filter elements necessarily limited the heat generated by high current conduction cannot be adequately dissipated. As a result, the connectors overheat and, ultimately, fail.

In order to overcome this problem some prior art connectors employ a relatively wide metal ground plate. While such wide metal plates have sufficient mass and conductivity to dissipate the extreme heat generated by high RF current conduction, they are not flexible and, as a result, are not suitable for making low resistance wiping contact with the surface of the network filter ground electrodes. Hence, other means must be provided for establishing the required electrical connection between the ground plate and the network filter ground electrodes. In some prior art connectors the network ground electrode, and therefore the filter itself, is conductively bonded to the ground plate with a conductive adhesive, such as conductive epoxy. This approach, however, engenders other disadvantages. For example, each ground electrode must be individually bonded to the ground plate. Typically, a single connector may include as many as 120 network filters, and as a result, the manufacturing costs in fabricating such a connector in this manner is extremely high. In addition, after fabrication, should one of the network filters be found to be defective, in most cases, the entire connector must be discarded since replacement of the faulty network filter is usually not possible. Moreover, removal of the faulty network filter, if possible, would jeopardize the bond between the ground plate and the other network filters. One suggested solution to this problem is to test each individual network filter prior to its placement and bonding within the connector. But even this approach fails to provide a complete answer because there is always the possibility that one or more of these fragile filters might be damaged during network filter installation and bonding within the connector.

A number of the above considerations have ben addressed in the referenced U.S. patent application Ser. No. 875,363 wherein conductive epoxy is employed in a connector to form a common grounding plate in electrical connection with a plurality of tubular capacitors which function as contact filters. Such construction is capable of dissipating heat at rates as considered herein. Epoxy grounding plates as considered in Ser. No. 875,363 have been bonded directly to encapsulating connector housings or have been electrically connected to the housings by intermediate grounding springs, but it has been recognized that improved conductivity between the grounding plates and housings would be desirable.

SUMMARY OF THE INVENTION

It is therefore a general object of the present invention to provide a new and improved high RF current filter connector which avoids the disadvantages and problems associated with prior art connector constructions.

It is another general object of the present invention to provide a new and improved method of fabricating a high RF current filter connector at greatly reduced manufacturing cost.

It is a still further object of the present invention to provide a filter connector wherein individual bonding of the network filter ground electrodes to the connector ground plate is avoided.

A feature of the present invention resides in a filter connector having a conductive epoxy ground plate with an encircling ring means for establishing an improved electrical connection between the ground plate and connector housing.

Accordingly, the invention is generally directed, in one of its broader aspects, to a filter connector including an electrically conductive outer shell, an inner body within the shell including a ground plate electrically coupled to the shell, and at least one channel extending through the body and the ground plate including an extraneous signal filter means within at least a portion of the channel and ground and pin electrodes with the ground electrode being electrically coupled to the ground plate. A contact member is electrically coupled to the pin electrode when disposed within the channel.

The ground plate comprises, in part, conductive filler material within a cavity, which extends transversely to and intersects the channel. The conductive filler material is electrically coupled to the shell through an encircling conductive metallic ring and contacts the network ground electrode for establishing a ground plate in conjunction with the metallic ring.

The metallic ring is in turn electrically connected to the shell of the connector by a resilient spring. In this arrangement, with the epoxy firmly bonded to the ring, which may be silver plated, a highly dependable circuit is established through the epoxy and bonded ring to the connector shell.

In addition, conductive metallic plates may be included to extend transversely to the ring and ground electrode so as to be in electrical connection with each. The plates may form the end faces of the cavity and be bonded to the epoxy to enhance the electrical and structural integrity of the ground plate.

The invention is still further directed to a method of fabricating a ground plate for a filter connector of the type which includes an outer conductive shell having an inner surface, an inner body, and a filter network contact assembly within the body having a ground electrode. The method comprises the steps of providing a cavity within the shell around the ground electrode by placement in the shell of a conductive grounding ring and thereafter flowing conductive filler material into the cavity formed in part by the ring. The filler material flows into contact with the ground electrode and into electrical contact with the ring and the transversely extending end face plates, if present.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENTS

Figure 2:
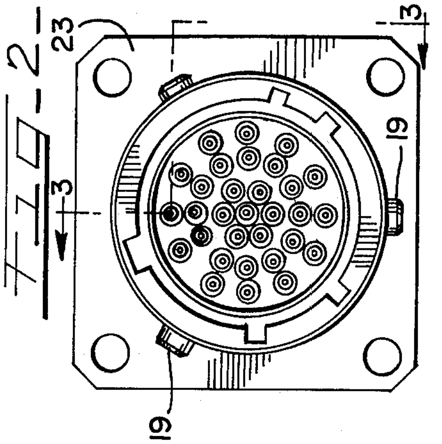
FIG. 2 is a left-hand end view of the connector illustrated in FIG. 1.
Figure 1:
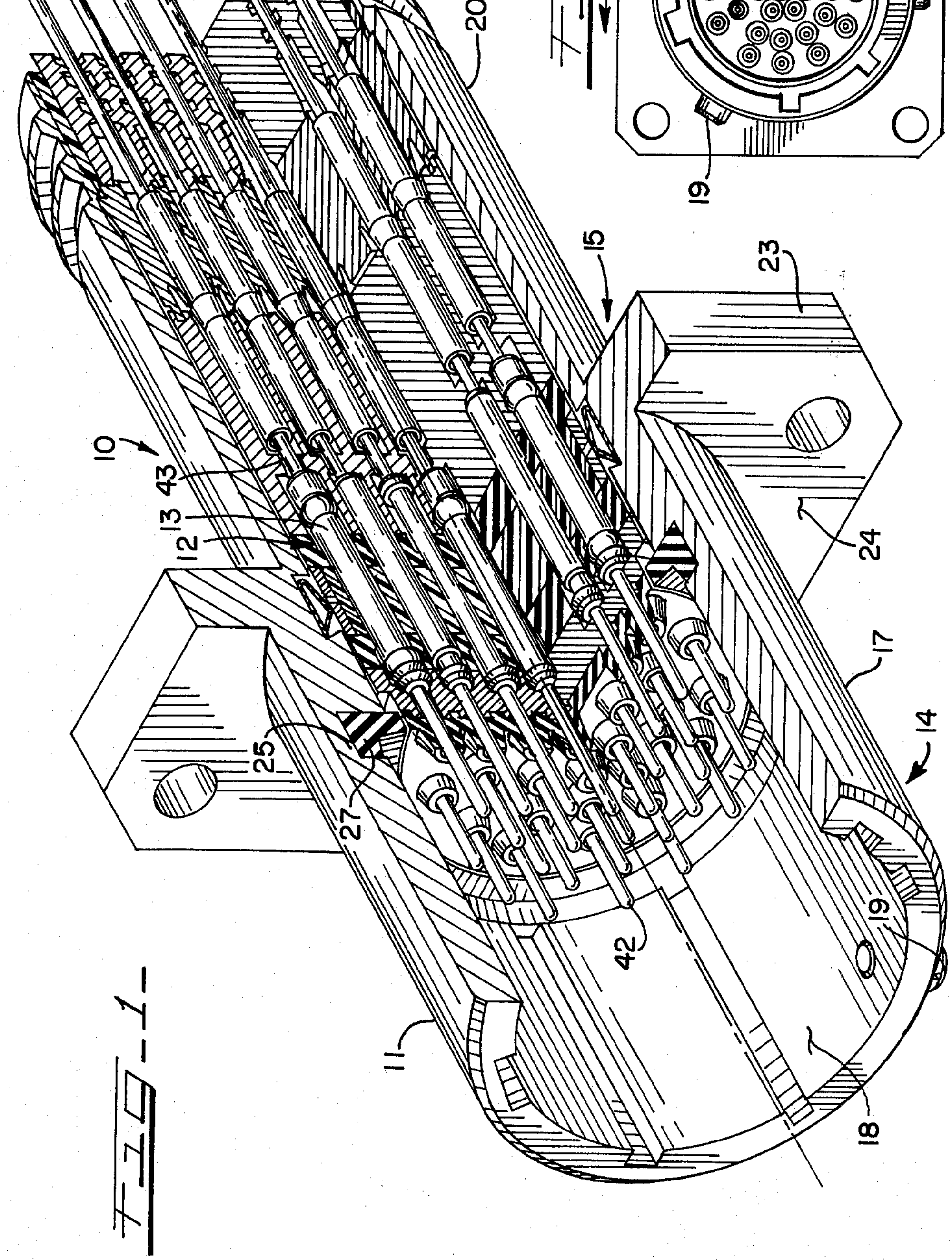
FIG. 1 is a perspective view, partly in section, illustrating a filter connector having a filter network in connection with one of the ground plate embodiments of the present invention.

Referring now to FIG. 1, the connector 10 there illustrated is of the type generally referred to as an in-line filter connector. In general, it includes a conductive outer shell 11, an inner body portion 12, and a plurality contact filter network subassemblies 13.

The conductive outer shell is preferably formed from metal, such as aluminum. It includes a forward end 14, a middle section 15, and a rear end 16. The forward end 14 includes an annular flange 17 defining a cavity 18 which is dimensioned to receive a mating connector dielectric insert. A pin 19 is carried on and radially extends from the flange 17 to provide a key. The key is dimensioned for being received by a recess within the mating connector outer shell (not shown) for aligning the contacts of the mating connector with the contacts of the connector 10. The key 19, in those instances where the mating connector has a bayonet-type inclined recess within its outer ring, may also serve as a post to achieve bayonet mating of the two connectors.

The rear end 16 similarly includes an annular flange 20 which is also dimensioned and adapted for combination with another mating connector.

The shell or housing 11 further includes, intermediate the forward end 14 and middle section 15, a radially extending circumferential flange 23. Flange 23 has a forward surface 24. The forward surface 24 may be utilized for abutting a mating connector to limit its penetration into the cavity 18. The forward surface 24 may additionally be utilized for abutting the surface of a bulkhead should bulkhead mounting be desirable.

The forward flange 17 includes a circumferential slot 25 for receiving a correspondingly shaped annular sealing ring 27. The annular sealing ring 27 is preferably formed from resilient material, such as a fluorosilicon rubber. The seal 27 provides annular sealing between the connector 10 and the connector to be mated thereto. Similar types of construction not relevant to the instant invention could be provided at the other end of the connector.

Figures 3, 4:
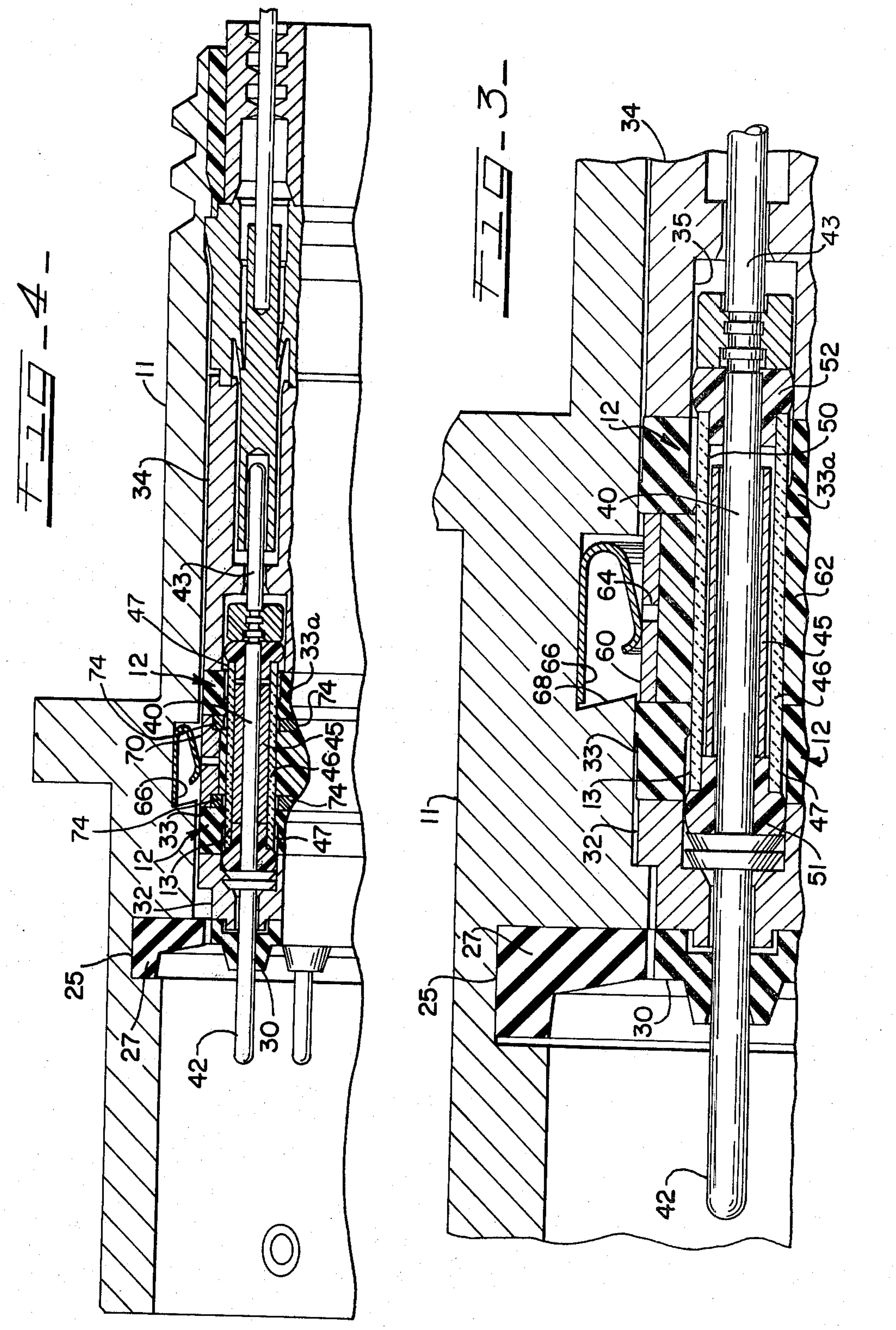
FIG. 3 is a detailed view of one embodiment of the ground plate construction taken in section about line 3—3 of FIG. 2.
FIG. 4 is a detailed view similar to FIG. 3 illustrating an alternative embodiment of the ground plate construction of the present invention as including conductive discs or plates for forming the end faces of the ground plate subassembly.
Figure 5:
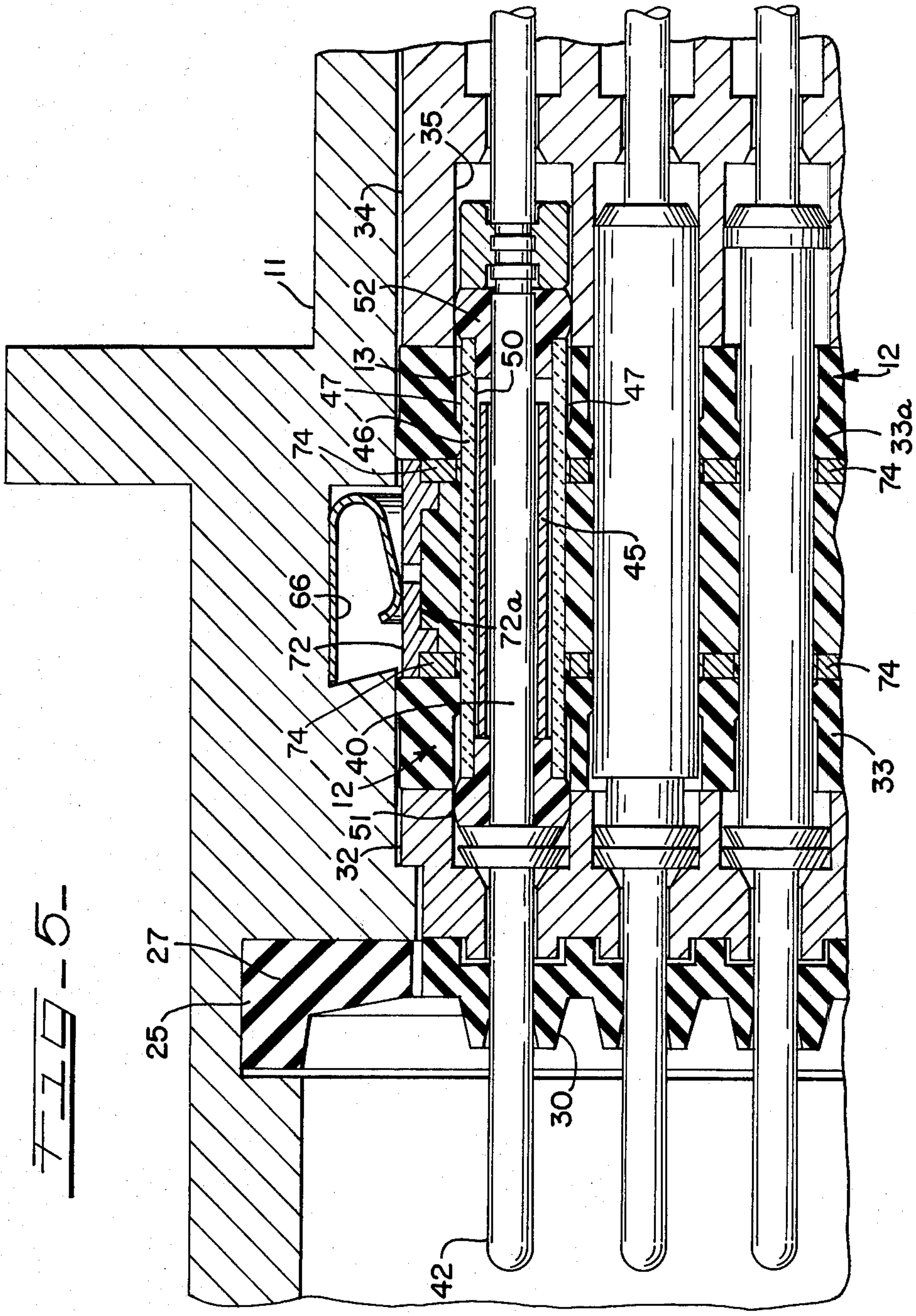
FIG. 5 is a longitudinal view, partly in section, of the ground plate embodiment illustrated in FIG. 4, illustrating the same in combination with multiple filter networks.

The inner body portion 12 is contained within the middle section 15 of housing 11. As best shown in FIG. 3, the inner body portion includes a plurality of inserts which are arranged side-by-side to form the inner body. The inserts comprise a forward face seal 30, a first dielectric insert 32, a first non-conductivemounting gasket 33 for the ground plate subassemblies forming the present invention and to be described in detail hereinbelow, a second mounting gasket 33*a* and a second dielectric insert 34. Each of the inserts includes a through bore. The bores are aligned to form a channel 35 extending through the inner body 12. Although one channel is illustrated in FIGS. 3 and 4, it is, of course, to be understood that a filter connector of the type illustrated may have a plurality of such channels as shown in FIGS. 1 and 5. The bores within the inserts are individually dimensioned so that the resulting through channel 35 is dimensioned generally corresponding to the outer dimension of the contact filter network assembly 13.

Each contact filter network assembly is rested in a channel 35 and includes a contact member 40, having a forward contact portion 42 which extends into the forward cavity 18 and a rear contact portion 43 extending towards the rear portion of the connector. Contact portions 42 and 43 are both of the pin variety which is characteristic of one type of in-line connector.

The filter network subassembly 13 is axially carried between the ends of contact member 40. The filter network includes a ferrite tubular member 45 disposed about contact member 40 and a ceramic tubular member 46 coaxially disposed about the contact member 40 and the ferrite member 45. The ceramic member 46 is plated on its external surface with conductive material to form the ground electrode 47 of the filter network.

The ceramic member 46 also includes conductive plating on its inner surface forming the pin electrode 50 of the network filter. A forward conductive elastomeric sleeve 51 and a rear conductive elastomeric sleeve 52 are carried by contact member 40 and are partially disposed between the ceramic member 46 and the contact member 40 to electrically couple the pin electrode 50 to the contact member 40. As a result, an equivalent Pi network filter is formed which is secured to the contact member 40.

One embodiment of the present invention is illustrated in FIG. 3. As shown therein, a transversely extending cavity is defined by the inner body elements 33 and 33*a*. An annular ring means 60 is disposed between elements 33 and 33*a* to encircle the filter element 46. The annular cavity thereby defined by the inner surface of ring 60, the outer surface of filter element 46 and the opposing faces of inner body elements 33 and 33*a* are filled with a curable conductive filler material 62 which, together with ring 60, forms the ground plate of the connector. The filler material becomes integrally bonded to ring 60 and thereby maintains a highly effective electrical connection therewith. The surface of ring 60 may be silver-plated to further enhance this electrical connection. Ring 60 includes an aperture 64 therein through which the filler material 62 may be injected. Although not shown, another aperture 64 may be diametrically disposed in the ring 60 to facilitate gating of injected filler material. The ground plate formed by filler material 62 and ring 60 is electrically coupled to the connector housing by a spring member 66 which is confined within an annular recess 68 in the connector housing.

A suitable material which may be utilized to constitute the conductive filler material may be curable conductive epoxy, such as silver loaded epoxy. The use of the conductive filler material for establishing the ground plate of the filter connector is advantageous because the conductive filler material may be introduced into the cavity around the network filters so that each of the network filters is coupled to the ground plate during the same fabricating step. Hence, individual bonding by hand of each of the filter networks to the ground plate is avoided. Additionally, the sidewalls of the transverse cavity formed by elements 33 and 33*a* may be sufficiently spaced to provide a ground plate of substantial width to enable the connector to accommodate high RF currents.

It is desirable that the filter network and grounding ring not be subjected to any axial stress applied to the contact member so that the bond between the filler material, the filter network and ring 60 is protected. Such protection is afforded by the provision of the conductive elastomeric sleeves 51 and 52, which absorb axial movements which might otherwise be imparted to the contact member.

Referring now to the embodiments illustrated in FIGS. 4 and 5, it is to be noted that a grounding ring 70 and 72 respectively is illustrated having shoulder means formed in the end faces thereof for receiving transversely extending conductive plates 74. The conductive plates 74 are in broad surface contact with the conductive filler material. Since the plates 74 become bonded to the filler material and are in electrical connection with ground ring 70 and 72, respectively the ground electrode 47, highly efficient grounding of the ground electrode to the connector housing is provided. As with ring 64, rings 70 and 72 may include diametrically disposed apertures for injecting the filler material. As in the FIG. 3 embodiment, the grounding spring 66 is provided to connect the rings to the connector housing.

It is to be noted in FIG. 5 that the grounding ring 72 includes a cut-out relief portion 72a on its inner radial surface. Such relief portion is provided in the event that additional cavity space is desired between the ground electrode and the grounding ring. However, since additional machining would be necessary to form ring 72, it is anticipated that ring 70 would be preferred over ring 72 when conductive plates 74 are utilized. Conductive plate 74 and associated grounding ring form an integral part with the filler material thereby forming a cohesive grounding plate with respect to the filter network.

From the foregoing, it can be seen that the method of fabricating a filter connector ground plate in accordance with the present invention provides improved conductivity between the filter network and connector housing. With the ground plates being formed from conductive filler material, such as epoxy, which is injected into a cavity of the inner body of the connector to make contact with the ground electrodes of all of the filter networks during the same fabrication process step, the tedious individual hand-bonding of each of the network filters to the ground plates is avoided.

While particular embodiments of the present invention have been shown and described, modifications can be made, and it is intended in the appended claims to cover all such changes and modifications which fall within the true spirit and scope of the invention.

We claim:

1. A filter connector comprising:

a conductive housing;

an inner body within said housing including at least one longitudinally extending opening and a transversely extending cavity communicating with said opening and said housing;

a filter network means within said opening and at least a portion of said cavity, said network means including an outer ground electrode within at least a portion of said cavity and a pin electrode;

a contact means within said network means, said contact means being electrically coupled to said pin electrode;

conductive filler material within said cavity surrounding and being in electrical connection with said ground electrode; and a ring means being formed of rigid, electrically conductive material surrounding said filler material along the longitudinal length thereof and being bonded in electrical connection therewith, and said ring means also being electrically coupled to said housing so that said filler material and said ring means form a ground plate for said filter network.

2. A filter connector as set forth in claim 1 wherein said ring means is formed of metallic material into an annular configuration.

3. A filter connector as defined in claim 1 wherein said conductive filler material surrounds said ground electrode and makes substantial surface contact therewith.

4. A filter connector as set forth in claim 1 further comprising a conductive spring means disposed between said ring means and said housing for electrically coupling said ground plate formed by said ring means and said filler material to said housing.

5. A filter connector as set forth in claim 1 wherein said conductive filler material comprises conductive epoxy.

6. A filter connector as set forth in claim 5 wherein said conductive epoxy comprises silver loaded epoxy.

7. A filter subassembly adapted for mounting in an electrical connector having a conductive housing, said subassembly comprising:

a filter network means having an outer ground electrode and a pin electrode, said pin electrode being adapted for electrical connection to a contact means;

conductive epoxy surrounding and being in electrical connection with said ground electrode; and a ring means formed of metallic material into an annular configuration surrounding said epoxy and being bonded into electrical connection therewith, said ring means being adapted for generally concentric disposition within the conductive housing of the connector for electrical connection therewith so that said epoxy and said ring means form a ground plate for said filter network means.

8. A filter subassembly adapted for mounting in an electrical connector having a conductive housing, said subassembly comprising:

a tubular filter network means having an outer ground electrode and a pin electrode, said pin electrode being adapted for electrical connection to a contact means;

a ring means formed of metallic material into an annular configuration surrounding said ground electrode and being radially spaced therefrom; and a pair of longitudinally spaced conductive plates extending transversely to said filter network means between said filter network means and said ring means, at least one of said plates being in electrical connection with said ground electrode and said ring means, and the cavity defined by said ring means, said plates and said ground electrode being filled with conductive epoxy so as to be bonded to said ring means, said plates and said ground electrode to form a ground plate for said filter network means.

9. A filter connector as set forth in claim 8 wherein said ring means includes shoulder means on the inner circumferential surface thereof receiving said pair of spaced plates.

10. A filter connector as set forth in claim 9 wherein the inner circumferential surface of said ring means includes a cut-out relief portion disposed between said shoulder means.

11. A method of forming a ground plate subassembly for use in a filter connector of the type which includes a conductive housing and a filtered contact subassembly having a ground electrode means disposed within said housing, said method comprising the steps of:

placing a ring means of conductive metallic material about said ground electrode means in a concentric relationship therewith, said ring means being adapted for generally concentric disposition within the conductive housing of the connector;

defining an annular cavity about said ground electrode means, said cavity in part being defined by said ring means; and flowing conductive filler material into said cavity about and into electrical contact with said ground electrode means and into electrical contact with said ring means.

12. A filter connector as set forth in claim 11 wherein said conductive filler material comprises conductive epoxy.

13. A filter connector as set forth in claim 12 wherein said conductive epoxy comprises silver loaded epoxy.

14. A method of forming a ground plate subassembly for use in a filter connector of the type which includes a conductive housing and a filtered contact subassembly having a tubular ground electrode means disposed within said housing, said method comprising the steps of:

defining an annular cavity about said ground electrode means by placing a ring means of conductive metallic material about said ground electrode means in a concentric relationship therewith by placing a pair of longitudinally spaced conductive plates over said tubular ground electrode means in a transverse relationship therewith so as to be in electrical contact with said tubular ground electrode means and said ring means; and flowing conductive filler material into said cavity around and into electrical contact with said tubular ground electrode means, said plates and said ring means.

15. A filter connector as set forth in claim 14 wherein said conductive filler material comprises conductive epoxy.

16. A filter connector as set forth in claim 15 wherein said conductive epoxy comprises silver loaded epoxy.

17. A method of forming a ground plate subassembly as set forth in claim 14 including the further step of providing a bore through said ring means to said cavity and thereafter injecting said conductive filler material through said bore into said cavity.

18. A filter connector comprising:

a conductive housing;

an inner body within said housing including at least one longitudinally extending opening and a transversely extending cavity communicating with said opening and said housing;

a filter network means within said opening and at least a portion of said cavity, said network means including an outer ground electrode within at least a portion of said cavity and a pin electrode;

a contact means within said network means, said contact means being electrically coupled to said pin electrode;

conductive filler material within said cavity surrounding and being in electrical connection with said ground electrode;

a ring means being formed of rigid, electrically conductive material surrounding said filler material and being bonded in electrical connection therewith, and said ring means also being electrically coupled to said housing so that said filler material and said ring means form a ground plate for said filter network;

a conductive spring means disposed between said ring means and said housing for electrically coupling said ground plate formed by said ring means and said filler material to said housing;

a pair of longitudinally spaced conductive plates correspondingly defining transversely extending end surfaces associated with said cavity with said plates being in electrical connection with said ring means and said filler material being bonded to said plates.

19. A filter connector comprising:

a conductive housing an inner body within said housing including at least one longitudinally extending opening and a transversely extending cavity communicating with said opening and said housing;

a filter network means within said opening and at least a portion of said cavity, said network means including an outer ground electrode within at least a portion of said cavity and a pin electrode;

a contact means within said network means, said contact means being electrically coupled to said pin electrode;

conductive filler material within said cavity surrounding and being in electrical connection with said ground electrode; and a ring means being formed of rigid, electrically conductive material surrounding said filler material and being bonded in electrical connection therewith, and said ring means also being electrically coupled to said housing so that said filler material and said ring means form a ground plate for said filter network wherein said housing and said ring means include means enabling injection of said filler material into said cavity.

20. A filter connector as set forth in claim 19 wherein said means enabling injection of said filler material into said cavity comprises aperture means in said ring means.

21. A filter connector as set forth in claim 20 wherein said means enabling injection of said conductive filler material into said cavity includes two diametrically disposed apertures in said ring means.

22. A filter connector comprising:

a conductive housing;

an inner body within said housing including at least one longitudinally extending opening and a transversely extending cavity communicating with said opening and said housing;

a filter network means within said opening and at least a portion of cavity, said network means including an outer ground electrode within at least a portion of said cavity and a pin electrode;

a contact means within said network means, said contact means being electrically coupled to said pin electrode;

conductive filler material within said cavity surrounding and being in electrical connection with said ground electrode;

a ring means being formed of rigid, electrically conductive material surrounding said filler material and being bonded in electrical connection therewith, and said ring means also being electrically coupled to said housing so that said filler material and said ring means form a ground plate for said filter network; and a pair of longitudinally spaced conductive plates corresponding defining transversely extending end surfaces associated with said cavity with said plates being in electrical connection with said ring means and said filler material being bonded to said plates.

23. A filter connector as set forth in claim 22 wherein said ring means is formed of metallic material into an annular configuration and includes shoulder means on the inner circumferential surface thereof receiving said pair of spaced plates.

24. A filter connector as set forth in claim 23 wherein the inner circumferential surface of said ring means includes a cut-out relief portion disposed between said shoulder means.

25. A filter connector as set forth in claim 23 wherein said ring means includes means enabling injection of said conductive filler material into said cavity whereby said ring means, said plates and said filler material form an integrally bonded subassembly.

26. A method of forming a ground plate subassembly for use in a filter connector of the type which includes a conductive housing and a filtered contact subassembly having a ground electrode means disposed within said housing, said method comprising the steps of:

placing a ring means of conductive metallic material about said ground electrode means in a concentric relationship therewith;

defining an annular cavity about said ground electrode means, said cavity in part being defined by said ring means;

flowing conductive filler material into said cavity about and into electrical contact with said ground electrode means and into electrical contact with said ring means; and providing a bore through said ring means to said cavity and thereafter injecting said conductive filler material through said bore into said cavity.

* * * * *